US 6,717,353 B1

(12) United States Patent
Mueller et al.

(10) Patent No.: US 6,717,353 B1
(45) Date of Patent: Apr. 6, 2004

(54) PHOSPHOR CONVERTED LIGHT EMITTING DEVICE

(75) Inventors: Gerd O. Mueller, San Jose, CA (US); Regina B. Mueller-Mach, San Jose, CA (US); Peter J. Schmidt, Aachen (DE); Thomas Jüstel, Aachen (DE); Gerry Sorce, Essex (GB)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 10/272,150

(22) Filed: Oct. 14, 2002

(51) Int. Cl.⁷ .................................................. H01J 1/62
(52) U.S. Cl. ........................ 313/501; 313/485; 313/486; 313/487; 313/502; 313/503; 252/301.4 R; 252/301.4 S
(58) Field of Search ................................. 313/501, 502, 313/503, 485, 486, 487; 252/301.4 R, 301.4 S

(56) References Cited

U.S. PATENT DOCUMENTS

2003/0141506 A1 * 7/2003 Sano et al. .................... 257/78

* cited by examiner

Primary Examiner—Vip Patel
Assistant Examiner—Holly Harper
(74) Attorney, Agent, or Firm—Patent Law Group LLP; Rachel V. Leiterman

(57) ABSTRACT

A device includes a semiconductor light emitting device and a wavelength-converting material comprising Sr—SiON:$Eu^{2+}$. The Sr—SiON:$Eu^{2+}$ wavelength-converting material absorbs light emitted by the light emitting device and emits light of a longer wavelength. The Sr—SiON:$Eu^{2+}$ wavelength-converting material may be combined with other wavelength-converting materials to make white light. In some embodiments, the Sr—SiON:$Eu^{2+}$ wavelength-converting layer is combined with a red-emitting wavelength-converting layer and a blue light emitting device to generate emission in colors, which are not achievable by only mixing primary and secondary wavelengths. In some embodiments, the Sr—SiON:$Eu^{2+}$ wavelength-converting layer is combined with a red-emitting wavelength-converting layer, a blue-emitting wavelength-converting layer, and a UV light emitting device.

23 Claims, 5 Drawing Sheets

PHOSPHOR CONVERTED LIGHT EMITTING DEVICE

BACKGROUND

1. Field of Invention

The invention relates generally to wavelength-converted light emitting devices.

2. Description of Related Art

Light emitting devices including light emitting diodes are well known solid state devices that can generate light having a peak wavelength in a specific region of the light spectrum. LEDs are typically used as illuminators, indicators, and displays. LEDs based on the III-nitride materials system have been developed that can efficiently emit light in a relatively narrow band around a peak wavelength in the blue to UV range of the spectrum. Since blue-UV light has a higher photo energy relative to other colors of visible light, such light generated by III-nitride LEDs can be readily converted to produce light having a longer wavelength. It is well known in the art that light having a first peak wavelength ("primary light") can be converted into light having a longer peak wavelength ("secondary light") using a process known as luminescence. The luminescence process involves absorbing the primary light by a photoluminescent phosphor material, which excites the atoms of the phosphor material, and emits the secondary light. The peak wavelength and the band of wavelengths around it (in short wavelength) of the secondary light will depend on the phosphor material. The type of phosphor material can be chosen to yield secondary light having a particular peak wavelength. Needed in the art are wavelength-converting materials (wavelength converters) that efficiently convert light in desired wavelength ranges and can withstand the same operating temperatures as the III-nitride light emitting devices.

SUMMARY

In accordance with embodiments of the invention, a device includes a semiconductor light emitting device and a wavelength-converting material comprising Sr—SiON:Eu$^{2+}$. The Sr—SiON:Eu$^{2+}$ wavelength-converting material absorbs light emitted by the light emitting device and emits light of a longer wavelength. In some embodiments, the Sr—SiON:Eu$^{2+}$ wavelength-converting material is combined with a red-emitting wavelength-converting material and a blue light emitting device. In some embodiments, the Sr—SiON:Eu$^{2+}$ wavelength-converter is combined with a red-emitting wavelength-converter, a blue-emitting wavelength-converter, and a UV light emitting device.

The use of Sr—SiON:Eu$^{2+}$ as a green wavelength-converting material offers several advantages including high chemical and thermal stability, enhanced color rendering in white devices due to a relatively wide emission band, and potentially inexpensive synthesis.

The designator Sr—SiON:Eu$^{2+}$ is used here and in the following for materials of the general formula $(Sr_{1-a-b}Ca_bBa_c)Si_xN_yO_z:Eu_a$ (a=0.002–0.2, b=0.0–0.25, c=0.0–0.25, x=1.5–2.5, y=1.5–2.5, z=1.5–2.5).

DETAILED DESCRIPTION

Figure 1:
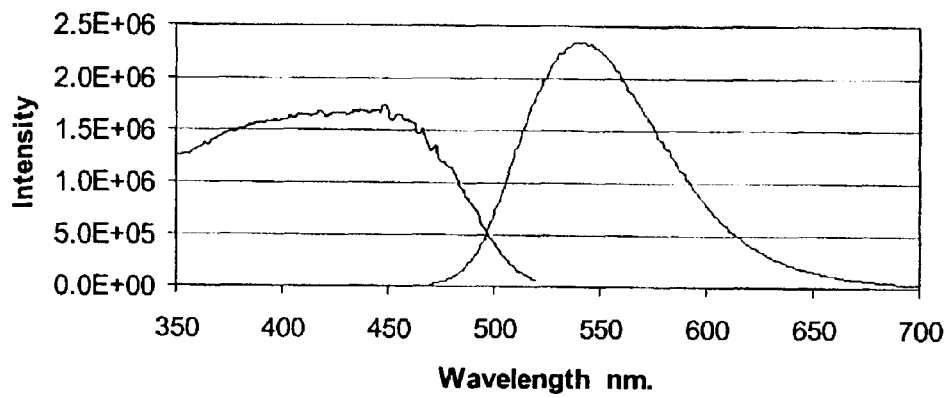
FIG. 1 illustrates the excitation and emission spectra of Sr—SiON:Eu$^{2+}$.

In accordance with embodiments of the invention, a light source includes a luminescent material for emitting green light. The luminescent material is Eu$^{2+}$ activated Sr—SiON having the formula $(S_{1-a-b}Ca_bBa_c)Si_xN_yO_z:Eu_a$ (a=0.002–0.2, b=0.0–0.25, c=0.0–0.25, x=1.5–2.5, y=1.5–2.5, z=1.5–2.5) and excitable by light with a wavelengt ranging from UV through blue. FIG. 1 illustrates the emission and excitation spectrum of Sr—SiON:Eu$^{2+}$.

Figure 2:
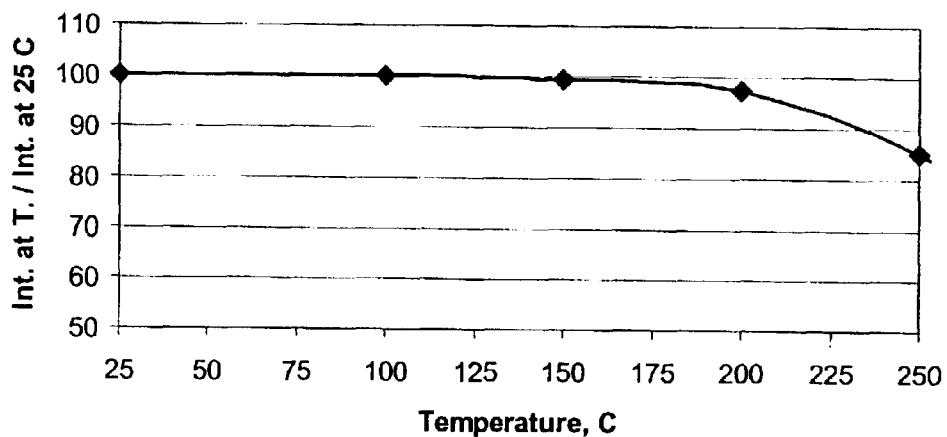
FIG. 2 illustrates the emission intensity as a function of temperature for Sr—SiON:Eu$^{2+}$, relative to the intensity at room temperature.

Sr—SiON:Eu$^{2+}$ has several advantages. Sr—SiON:Eu$^{2+}$ has low thermal quenching and is stable at high temperatures, permitting its use with light sources that operate at high temperatures. For example, at 170° C. Sr—SiON:Eu$^{2+}$ still exhibits nearly 100% of the room temperature emission intensity. In contrast, other green phosphors are quenched to 50% of the room temperature emission intensity at 170° C. FIG. 2 illustrates the emission intensity (normalized to room temperature emission intensity) as a function of temperature for Sr—SiON:Eu$^{2+}$. Sr—SiON:Eu$^{2+}$ also has excellent chemical stability and is potentially inexpensive to synthesize. In addition, in white light applications, Sr—SiON:Eu$^{2+}$ has a relatively wide emission band which enhances color rendering. The lumen equivalent is about 550 lm/W and leads to high overall luminous conversion efficiency of the respective devices. The parity-allowed radiative transition in the Eu$^{2+}$ ion is fast decaying (decay time less than 1 microsecond, which is advantageous for many applications.

Figure 3:
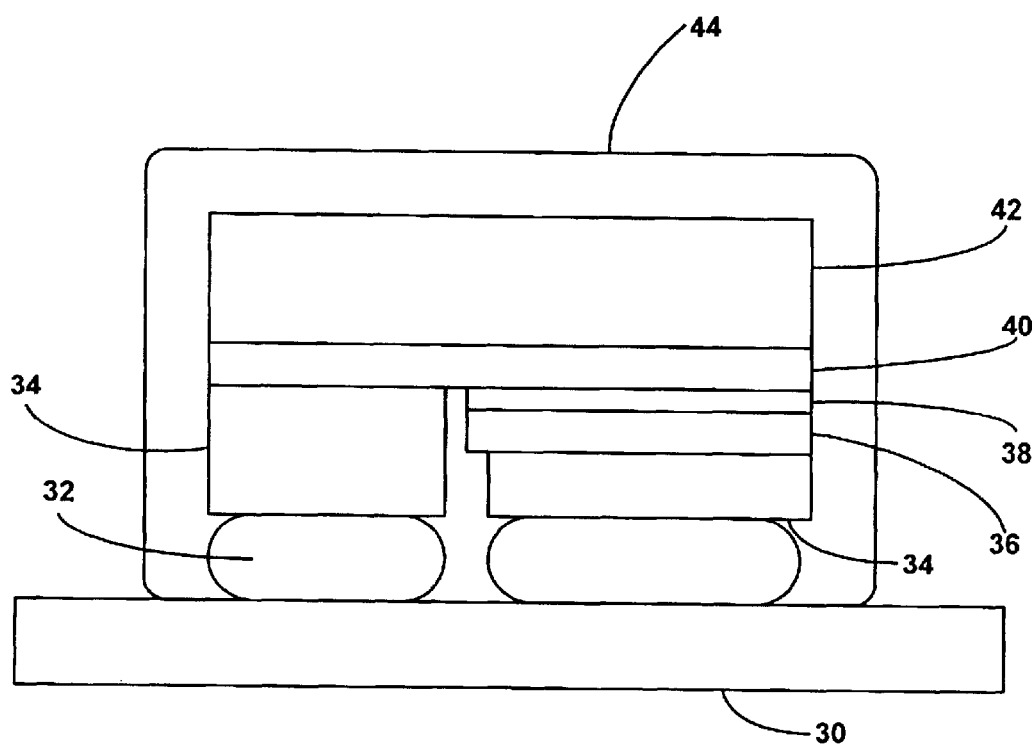
FIG. 3 illustrates an embodiment of a light emitting device incorporating a light emitting diode and Sr—SiON:Eu$^{2+}$.

The Sr—SiON:Eu$^{2+}$ material is suitable for use with any light source emitting light having a wavelength capable of exciting the Sr—SiON:Eu material, including, for example, discharge lamps and blue- and UV-emitting semiconductor light emitting devices such as light emitting diodes and laser diodes. FIG. 3 illustrates a first embodiment of a device incorporating a Sr—SiON:Eu$^{2+}$ material. Sr—SiON:Eu$^{2+}$ layer 44 covers a light emitting diode including an n-type region 40, and active region 38, and a p-type region 36 formed over a substrate 42. Contacts 34 are formed on the n- and p-type regions, then the light emitting diode is flipped over and electrically and physically connected to a submount 30 by interconnects 32. Sr—SiON:Eu$^{2+}$ layer 44 may be deposited by, for example, electrophoretic deposition, stenciling, or screen printing. Stenciling is described in "Stenciling Phosphor Coatings On Flip Chip Phosphor-LED Devices," U.S. application Ser. No. 09/688,053, and electrophoretic deposition is described in "Using Electrophoresis To Produce A Conformally Coated Phosphor-Converted Light Emitting Semiconductor Structure," U.S. application Ser. No. 09/879,627. Both applications are incorporated herein by reference. The light emitting device need not be a flip chip and may be oriented such that light is extracted from the device through the semiconductor device layers, rather than through the substrate.

Figure 4:
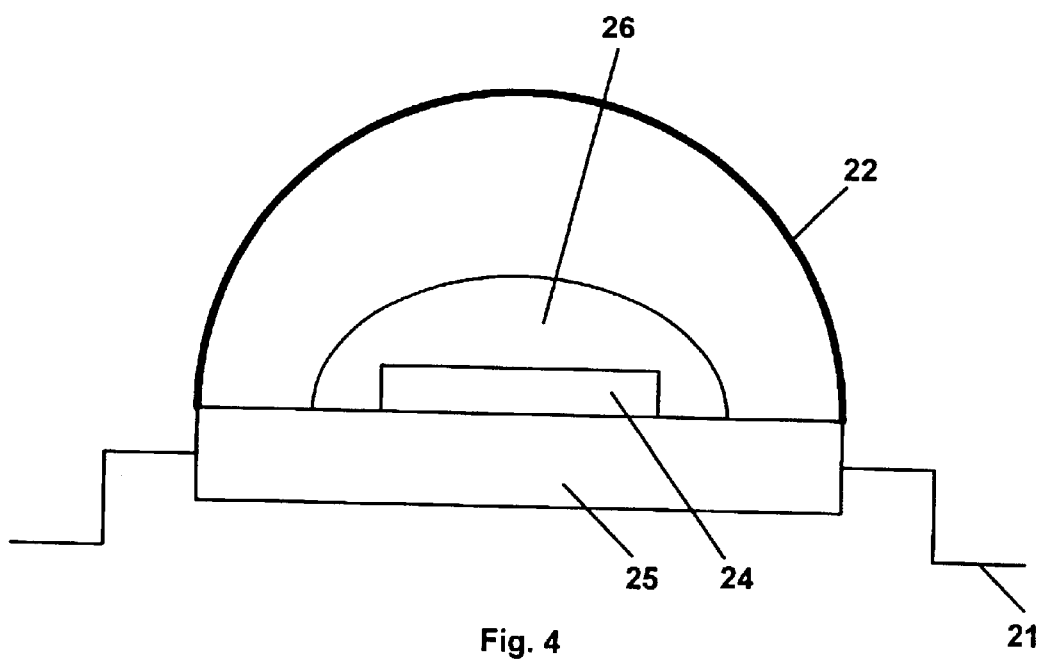
FIG. 4 illustrates an alternative embodiment of a light emitting device incorporating a light emitting diode and Sr—SiON:Eu$^{2+}$.

FIG. 4 illustrates a second embodiment of a device incorporating a Sr—SiON:Eu$^{2+}$ material. The device of FIG. 4 is a packaged light emitting diode including a light emitting diode 24 optionally mounted on a submount (not shown), supported by a base 25, and electrically connected to leads 21. A lens 22 protects light emitting diode 24. Sr—SiON:Eu$^{2+}$ may be dispersed in an encapsulant material 26 that is injected in a space between lens 22 and light emitting diode 24. The encapsulant may be, for example, silicone, epoxy, or any other organic or inorganic material, which is suitable for incorporating the light converter(s) and adheres to the primary light emitting device.

In some embodiments of the devices illustrated in FIGS. 3 and 4, the Sr—SiON:Eu$^{2+}$ material is the only wavelength-converting material. The amount of unconverted light from the light emitting diode mixing with the light emitted by the Sr—SiON:Eu$^{2+}$ is determined by the characteristics, such as thickness and amount of Sr—SiON:Eu$^{2+}$, of the layer containing the Sr—SiON:Eu$^{2+}$. In some embodiments, a filter material such as a dye may be incorporated into the device for filtering out any light unconverted by the Sr—SiON:Eu$^{2+}$. The use of a filter material is described in more detail in Application Serial No. 10/260,090, titled "Selective Filtering of Wavelength-converted Semiconductor Light Emitting Devices," filed Sep. 27, 2002, and incorporated herein by reference. For a blue-emitting light emitting diode, the light may range from bluish-green (some unconverted light from the light emitting diode allowed to escape) to green (no unconverted light allowed to escape). Such devices may be useful for applications requiring green light, such as, for example, green traffic lights or a backlight for a display. In one embodiment, the device is designed to generate green light of a centroid wavelength of 556 nm.

In some embodiments of the devices illustrated in FIGS. 3 and 4, the Sr—SiON:Eu$^{2+}$ is mixed with one or more additional wavelength-converting materials. Such devices may be used to create white light or to create light of a color that is difficult to achieve with a single wavelength-converting material. Each wavelength-converting material may be pumped by either light emitted by the light emitting diode or by light emitted by one of the other wavelength-converting materials. In some embodiments, Sr—SiON:Eu$^{2+}$ may be used in combination with a red-emitting phosphor and a blue light emitting diode to produce white light. Examples of suitable red-emitting phosphors include nitride silicate phosphors and sulfide phosphors such as $(Sr_{1-a-b-c}Ba_bCa_c)_2Si_5N_8:Eu_a$ (a=0.002–0.2, b=0.0–1.0, c=0.0–1.0); $(Ca_{1-x-a}Sr_x)S:Eu_a$ (a=0.0005 . . . 0.01, x=0.0–1.0); $Ca_{1-a}SiN_2:Eu_a$ (a=0.002–0.2) and $(B_{1-x-a}Ca_x)Si_7N_{10}:Eu_a$ (a=0.002–0.2, x=0.0–0.25).

Figure 5:
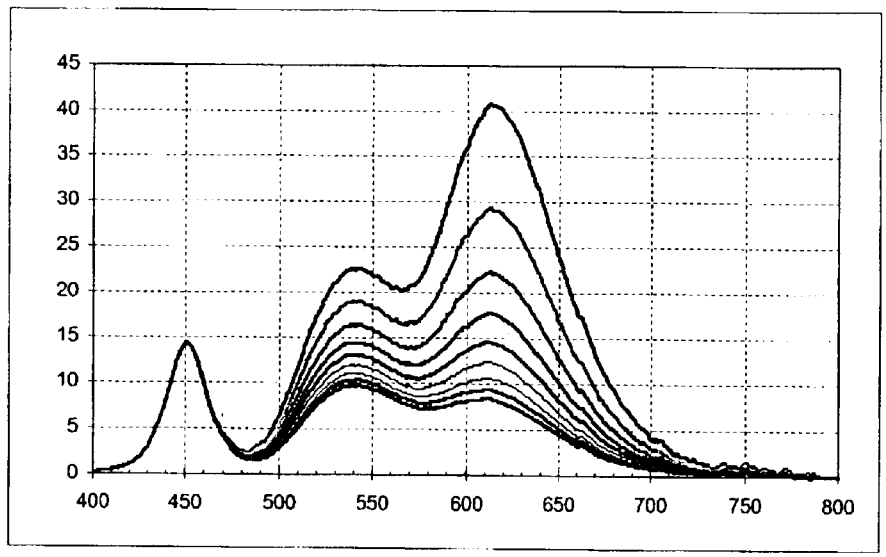
FIGS. 5–7 illustrate calculated emission spectra of several white devices including SiON:Eu$^{2+}$, showing emission in arbitrary units versus wavelength in nanometers.
Figure 6:
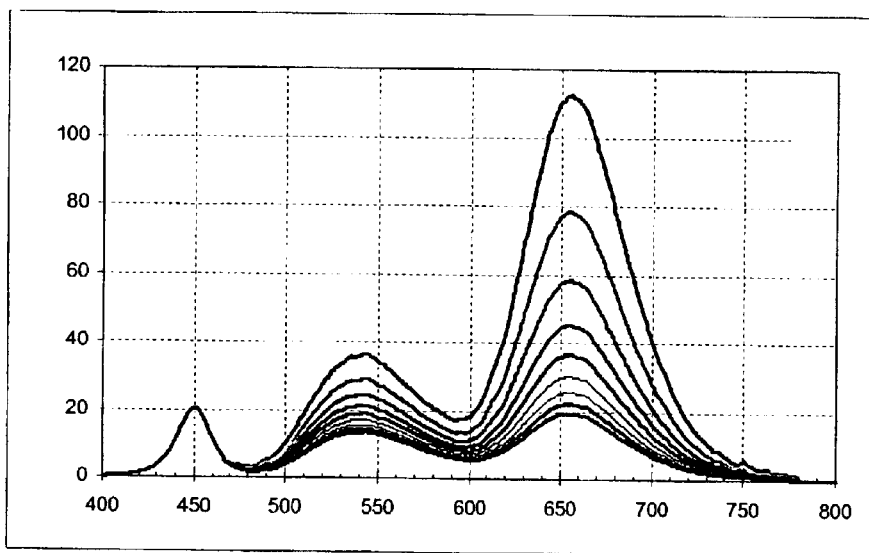
Figure 7:
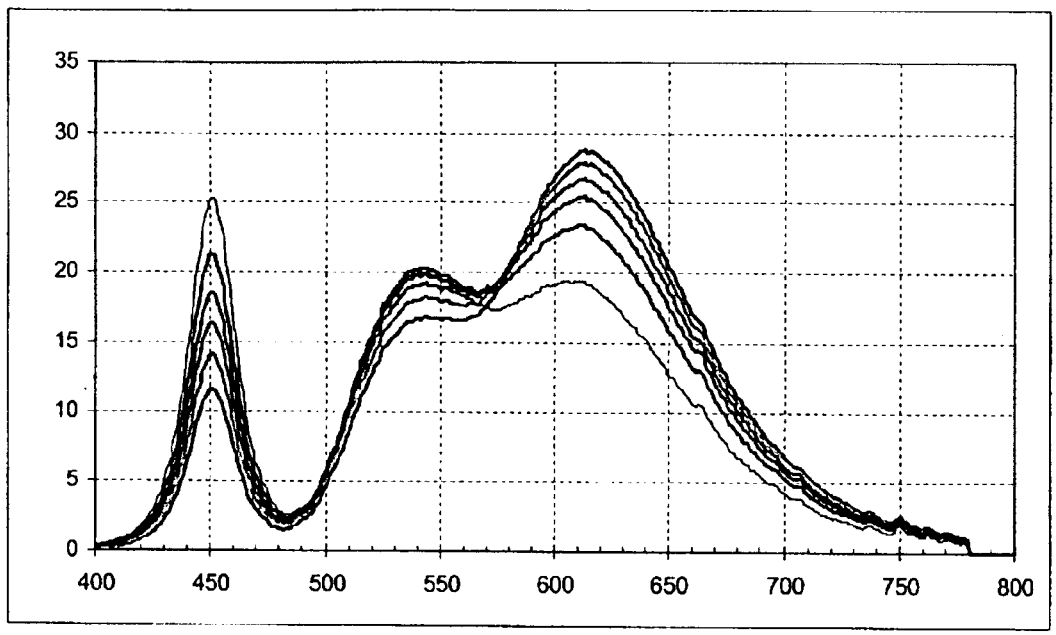

FIGS. 5–7 illustrate calculated emission spectra of white light emitting devices that combine a blue light emitting diode, Sr—SiON:Eu$^{2+}$, and a red-emitting phosphor. Each figure is accompanied by a table listing, for each spectrum, the color temperature CCT, the average color rendering index Ra, and the x and y coordinates on a chromaticity diagram. In each of FIGS. 5–7, the top most spectrum corresponds to the lowest color temperature and the bottom most spectrum corresponds to the highest color temperature.

FIG. 5 illustrates emission spectra of white light emitting devices with SrS:Eu$^{2+}$ as the red emitting phosphor. The devices illustrated in FIG. 5 exhibit no tint and have very high color rendering indices, for example between 85 and 90, at low color temperature. The table below lists CCT, Ra, and x and y for each of the spectra illustrated in FIG. 5:

| x | y | CCT,K | Ra |
|---|---|---|---|
| 0.4599 | 0.4107 | 2709 | 90 |
| 0.4369 | 0.4042 | 3001 | 89 |
| 0.4171 | 0.3964 | 3301 | 88 |
| 0.3999 | 0.3882 | 3601 | 86 |
| 0.3850 | 0.3798 | 3900 | 85 |
| 0.3721 | 0.3716 | 4200 | 84 |
| 0.3609 | 0.3639 | 4498 | 84 |
| 0.3511 | 0.3566 | 4797 | 83 |
| 0.3425 | 0.3499 | 5096 | 82 |

FIG. 6 illustrates emission spectra of white light emitting devices with CaS:Eu$^{2+}$ as the red emitting phosphor. The devices illustrated in FIG. 6 also exhibit no tint, but have significantly lower color rendering indices, for example between 62 and 72, at low color temperature. The table below lists CCT, Ra, and x and y for each of the spectra illustrated in FIG. 6:

| x | y | CCT,K | Ra |
|---|---|---|---|
| 0.4599 | 0.4107 | 2709 | 62 |
| 0.4369 | 0.4042 | 3001 | 66 |
| 0.4171 | 0.3964 | 3300 | 68 |
| 0.3999 | 0.3881 | 3600 | 70 |
| 0.3850 | 0.3798 | 3900 | 72 |
| 0.3721 | 0.3716 | 4199 | 74 |
| 0.3609 | 0.3639 | 4499 | 75 |
| 0.3511 | 0.3566 | 4797 | 76 |
| 0.3424 | 0.3498 | 5097 | 77 |

The use of (Sr,Ca)S:Eu$^{2+}$ as the red emitting phosphor is expected to offer better color rendering than CaS:Eu$^{2+}$ devices illustrated in FIG. 6 and worse color rendering than SrS:Eu$^{2+}$ devices illustrated in FIG. 5.

FIG. 7 illustrates emission spectra of white light emitting devices with $Sr_2Si_5N_8:Eu^{2+}$ as the red emitting phosphor. The devices illustrated in FIG. 7 exhibit no tint and have color rendering indices comparable to those of the SrS:Eu$^{2+}$ devices discussed above in reference to FIG. 5. In some devices, $Sr_2Si_5N_8:Eu^{2+}$ is favored as the red emitting phosphor due to its favorable chemical properties. The table below lists CCT, Ra, and x and y for each of the spectra illustrated in FIG. 7:

| x | y | CCT,K | Ra |
|---|---|---|---|
| 0.4599 | 0.4107 | 2709 | 87 |
| 0.4442 | 0.4065 | 2901 | 86 |
| 0.4300 | 0.4017 | 3101 | 86 |
| 0.4171 | 0.3964 | 3300 | 85 |
| 0.3999 | 0.3881 | 3600 | 84 |
| 0.3721 | 0.3717 | 4200 | 82 |

Figure 8:
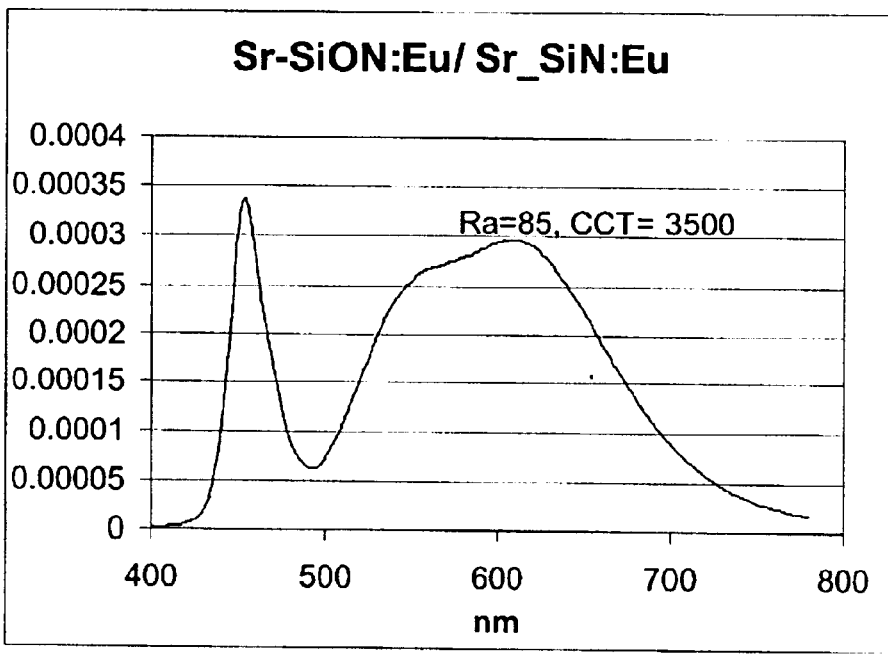
FIG. 8 illustrates an observed emission spectrum of a white device including a blue light emitting diode, Sr—SiON:Eu$^{2+}$ and $Sr_2Si_5N_8$:Eu$^{2+}$.

FIG. 8 illustrates an observed emission spectrum for a device including a blue light emitting diode, Sr—SiON:Eu$^{2+}$ and $Sr_2Si_5N_8:Eu^{2+}$.

In some embodiments, Sr—SiON:Eu$^{2+}$ may be used in combination with a red-emitting phosphor, a blue-emitting phosphor, and a UV light emitting diode to produce white light. Examples of suitable blue-emitting phosphors are $(Sr_{1-x-a}Ba_x)_3MgSi_2O_8:Eu_a$ (a=0.002–0.2, x=0.0–1.0); $(Sr_{1-x-a}Ba_x)P_2O_7:Eu_a$ (a=0.002–0.2, x=0.0–1.0); $(Sr_{1-x-a}Ba_x)_4Al_{14}O_{25}:Eu_a$ (a=0.002–0.2, x=0.0–1.0);

$La_{1-a}Si_3N_5:Ce_a$ (a=0.002–0.5); $(Y_{1-a})_2SiO_5:Ce_a$ (a=0.002–0.5); and $(Ba_{1-x-a}Sr_x)$ $MgAl_{10}O_{17}:Eu_a$ (a=0.01–0.5, x=0.0–0.5). The amounts of Sr—SiON:Eu2+, red-emitting phosphor, and blue-emitting phosphor are adjusted to create white light and to minimize the amount of UV light escaping unconverted from the device. In embodiments with multiple wavelength-converting materials, the Sr—SiON:Eu$^{2+}$ and other wavelength-converting materials may be separate layers formed one over the other or may be mixed in a single wavelength-converting material layer. For example, in a UV device according to FIG. 3 with red-, green-, and blue-emitting phosphors, the different phosphors may be mixed and deposited in a single layer, or may be deposited in three separate layers, usually blue adjacent to the light emitting diode, then green, then red. In a device according to FIG. 4, the phosphors may be mixed in a single encapsulant layer, or three layers of encapsulant, each containing a different phosphor, may be deposited over the light emitting diode. The Sr—SiON:Eu$^{2+}$ and any other wavelength-converting material may also be deposited as a thin film on at least one of the surfaces of the light emitting device.

In one example, Sr—SiON:Eu$^{2+}$ may be synthesized as follows: 208.98 g (1.415 mol) SrCO$_3$ is mixed with 12.3 g (0.059 mol) EuF$_3$ and 206.8 g (4.423 mol) SiN$_{4/3}$ (min. 98% purity) in dry ethanol under argon. The ethanol is removed in a stream of argon and the dried powder mixture is then fired at 1400° C. for 1 hr in an H$_2$/N$_2$ atmosphere over charcoal in a tungsten boat. After milling, the powder is fired at 1500° C. for 1 hr in an H$_2$/N$_2$ atmosphere, then milled and washed with water several times.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A device comprising:
    a semiconductor light emitting device capable of emitting light of a first wavelength; and
    a first wavelength-converting material comprising Sr—SiON:Eu$^{2+}$, the first wavelength-converting material disposed to absorb light of the first wavelength;
    wherein the first wavelength-converting material absorbs light of the first wavelength and emits light of a second wavelength longer than the first wavelength.

2. The device of claim 1 wherein the first wavelength ranges from blue to UV.

3. The device of claim 1 wherein the second wavelength is green.

4. The device of claim 1 further comprising a second wavelength-converting material, wherein the second wavelength-converting material absorbs light of one of the first wavelength and the second wavelength, and emits light of a third wavelength longer than the second wavelength.

5. The device of claim 4 wherein the third wavelength is red.

6. The device of claim 4 wherein the second wavelength-converting material is selected from the group consisting of $(Sr_{1-a-b-c}Ba_bCa_c)_2Si_5N_8:Eu_a$ (a=0.002–0.2, b=0.0–1.0, c=0.0–1.0); $(Ca_{1-x-a}Sr_x)S:Eu_a$ (a=0.0005 . . . 0.01, x=0.0–1.0); $Ca_{1-a}SiN_2:Eu_a$ (a0.002–0.2); and $(Ba_{1-x-a}Ca_x)Si_7N_{10}:Eu_a$ (a=0.002–0.2, x=0.0–0.25).

7. The device of claim 4 wherein the first wavelength is blue.

8. The device of claim 4 further comprising a third wavelength-converting material, wherein the third wavelength-converting material absorbs light of the first wavelength and emits light of a fourth wavelength longer than the first wavelength and shorter than the second wavelength.

9. The device of claim 8 wherein the first wavelength is UV, the second wavelength is green, the third wavelength is red, and the fourth wavelength is blue.

10. The device of claim 8 wherein the third wavelength-converting material is selected from the group consisting of $(Sr_{1-x-a}Ba_x)_3MgSi_2O_8:Eu_a$ (a=0.002–0.2, x=0.0–1.0); $(Sr_{1-x-a}Ba_x)_2P_2O_7:Eu_a$ (a=0.002–0.2, x=0.0–1.0); $(Sr_{1-x'a}Ba_x)_4Al_{14}O_{25}:Eu_a$ (a=0.002–0.2, x=0.0–1.0); $La_{1-a}Si_3N_5:Ce_a$ (a=0.002–0.5); $(Y_{1-a})_2SiO_5:Ce_a$ (a=0.002–0.5); and $(Ba_{1-x-a}Sr_x)MgAl_{10}O_{17}:Eu_a$ (a=0.01–0.5, x=0.0–0.5).

11. The device of claim 8 wherein the amounts of first wavelength-converting material, second wavelength-converting material, and third wavelength-converting material are selected to prevent light of the first wavelength from escaping the device.

12. The device of claim 1 further comprising a filter material capable of absorbing light of the first wavelength.

13. The device of claim 1 wherein the second wavelength comprises a centroid wavelength of 556 nm.

14. The device of claim 1 wherein the light emitting device is a III-nitride light emitting diode.

15. The device of claim 1 wherein the first wavelength-converting material is coated on a top surface and a side surface of the light emitting device.

16. The device of claim 1 further comprising:
    a pair of leads electrically connected to the light emitting device; and
    a lens disposed over the light emitting device.

17. The device of claim 16 wherein the first wavelength-converting material is dispersed in an encapsulant disposed between the light emitting device and the lens.

18. The device of claim 16 wherein the light emitting device is mounted such that light is extracted from the light emitting device through a transparent substrate.

19. A device comprising:
    a III-nitride light emitting diode;
    a green emitting phosphor comprising Sr—SiON:Eu$^{2+}$; and
    a red emitting phosphor;
    wherein the green emitting phosphor and the red emitting phosphor are disposed over the III-nitride light emitting diode.

20. The device of claim 19 wherein the red emitting phosphor is selected from the group consisting of $(Sr_{1-a-b-c}Ba_bCa_c)_2Si_5N_8:Eu_a$ (a=0.002–0.2, b=0.0–1.0, c=0.0 –1.0); $(Ca_{1-x-a}Sr_x)S:Eu_a$ (a=0.0005 . . . 0.01, x=0.0–1.0); $Ca_{1-a}SiN_2:Eu_a$ (a=0.002–0.2); and $(Ba_{1-x-a}Ca_x)Si_7N_{10}:Eu_a$ (a=0.002–0.2, x=0.0–0.25).

21. The device of claim 19 further comprising a blue emitting phosphor disposed over the III-nitride light emitting diode.

22. The device of claim 21 wherein the blue emitting phosphor is selected from the group consisting of $(Sr_{1-x-a}Ba_x)_3MgSi_2O_8:Eu_a$ (a=0.002–0.2, x=0.0–1.0); $(Sr_{1-x-a}Sr_x)_2P_2O_7:Eu_a$ (a=0.002–0.2, x=0.0–1.0); $(Sr_{1-x-a}Ba_x)_4Al_{14}O_{25}:Eu_a$ (a=0.002–0.2, x=0.0–1.0); $La_{1-a}Si_3N_5:Ce_a$ (a=0.002–0.5); $(Y_{1-a})_2SiO_5:Ce_a$ (a=0.002–0.5); and $(Ba_{1-x-a}Sr_x)MgAl_{10}O_{17}:Eu_a$ (a=0.01–0.5, x=0.0–0.5).

23. The device of claim 19 wherein the green emitting phosphor absorbs light emitted by the blue emitting phosphor and emits green light.

* * * * *